United States Patent
Verbrugge et al.

(10) Patent No.: US 6,359,419 B1
(45) Date of Patent: Mar. 19, 2002

(54) QUASI-ADAPTIVE METHOD FOR DETERMINING A BATTERY'S STATE OF CHARGE

(75) Inventors: Mark William Verbrugge, Troy; Edward Dean Tate, Jr., Grand Blanc; Shawn D. Sarbacker, Royal Oak; Brian James Koch, Berkley, all of MI (US)

(73) Assignee: General Motors Corporation, Detroit, MI (US)

( * ) Notice: Subject to any disclaimer, the term of this patent is extended or adjusted under 35 U.S.C. 154(b) by 0 days.

(21) Appl. No.: 09/748,097

(22) Filed: Dec. 27, 2000

(51) Int. Cl.[7] .......................... C02J 7/00; G01N 27/416
(52) U.S. Cl. ........................... 320/132; 324/428
(58) Field of Search .......................... 320/132; 324/427, 324/428; 702/63

(56) References Cited

U.S. PATENT DOCUMENTS

| | | | | |
|---|---|---|---|---|
| 4,595,880 A | * | 6/1986 | Patil | 324/427 |
| 5,187,424 A | * | 2/1993 | Benz et al. | 320/132 |
| 5,563,496 A | * | 10/1996 | McClure | 320/128 |
| 5,796,239 A | * | 8/1998 | Van Phuoc et al. | 320/107 |
| 5,963,016 A | * | 10/1999 | Arai et al. | 320/132 |
| 6,262,577 B1 | * | 7/2001 | Nakao et al. | 324/425 |

FOREIGN PATENT DOCUMENTS

JP 07151841 * 6/1995 .......... H01M/10/48

\* cited by examiner

Primary Examiner—Gregory Toatley
(74) Attorney, Agent, or Firm—Christopher DeVries (57) ABSTRACT

A method and apparatus for determining the state of charge of a battery including determining a current-based state of charge measurement based on coulomb integration, determining a voltage-based state of charge measurement based on the resistance of said battery and a hysteresis voltage, and combining the current-based state of charge measurement and the voltage-based state of charge measurement to generate the state of charge measurement of the battery.

17 Claims, 4 Drawing Sheets

QUASI-ADAPTIVE METHOD FOR DETERMINING A BATTERY'S STATE OF CHARGE

TECHNICAL FIELD

The present invention relates to a battery pack operating in a hybrid-electric powertrain for a vehicle. More specifically, the present invention relates to a method of managing the state of charge for the battery pack.

BACKGROUND OF THE INVENTION

In today's automotive market, there exist a variety of propulsion or drive technologies used to power vehicles. The technologies include internal combustion engines (ICEs), electric drive systems utilizing batteries and/or fuel cells as an energy source, and hybrid systems utilizing a combination of internal combustion engines and electric drive systems. The propulsion systems each have specific technological, financial, and performance advantages and disadvantages, depending on the state of energy prices, energy infrastructure developments, environmental laws, and government incentives.

The increasing demand to improve fuel economy and reduce emissions in present vehicles has led to the development of advanced hybrid vehicles. Hybrid vehicles are classified as vehicles having at least two separate power sources, typically an internal combustion engine and an electric traction motor. Hybrid vehicles, as compared to standard vehicles driven by an ICE, have improved fuel economy and reduced emissions. During varying driving conditions, hybrid vehicles will alternate between separate power sources, depending on the most efficient manner of operation of each power source. For example, during most operating conditions, a hybrid vehicle equipped with an ICE and an electric motor will shut down the ICE during a stopped or idle condition, allowing the electric motor to propel the vehicle and eventually restart the ICE, improving fuel economy for the hybrid vehicle.

Hybrid vehicles are broadly classified into series or parallel drivetrains, depending upon the configuration of the drivetrains. In a series drivetrain utilizing an ICE and an electric traction motor, only the electric motor drives the wheels of a vehicle. The ICE converts a fuel source to mechanical energy to turn a generator, which converts the mechanical energy to electrical energy to drive the electric motor. In a parallel hybrid drivetrain system, two power sources such as an ICE and an electric traction motor operate in parallel to propel a vehicle. Generally, a hybrid vehicle having a parallel drivetrain combines the power and range advantages of a conventional ICE with the efficiency and electrical regeneration capability of an electric motor to increase fuel economy and lower emissions, as compared with a traditional ICE vehicle. In addition, hybrid vehicles can incorporate both series and parallel paths. Further, hybrids are often described as being either charge depleting or charge sustaining with reference to a battery pack. Charge-depleting hybrids can be charged off the electrical grid; thus, these hybrids share many of the characteristics of purely electric vehicles. In contrast, the batteries in charge-sustaining hybrids receive all of their electrical charging from the ICE.

Battery packs having secondary/rechargeable batteries are an important component of hybrid vehicle systems, as they enable an electric motor/generator (MoGen) to store braking energy in the battery pack during regeneration and charging by the ICE. The MoGen utilizes the stored energy in the battery pack to propel or drive the vehicle when the ICE is not operating. During operation, the ICE will be shut on and off intermittently, according to driving conditions, causing the battery pack to be constantly charged and discharged by the MoGen. The state of charge (SOC, defined as the percentage of the full capacity of a battery that is still available for further discharge) is used to regulate the charging and discharging of the battery.

The preferred embodiment of the present invention utilizes a nickel/metal hydride (NiMH) battery in the battery pack. A NiMH battery stores hydrogen in a metal alloy to generate potential/voltage. When a NiMH cell is charged, hydrogen generated by the cell electrolyte is stored in the metal alloy (M) in the negative electrode. Meanwhile, at the positive electrode, which typically consists of nickel hydroxide loaded in a nickel foam substrate, a hydrogen ion is ejected and the nickel is oxidized to a higher valence. On discharge, the reactions reverse. The reaction at the negative electrode is more clearly shown by the following reaction diagram:

$$MH_x + OH^- \leftarrow\rightarrow MH_{x-1} + H_2O + e^-$$

The discharging direction is represented by $\rightarrow$. The charging direction is represented by $\leftarrow$.

On discharge, OH– ions are consumed at the negative hydride electrode and generated at the nickel oxide positive electrode. The converse is true for the water molecules.

Figure 1:
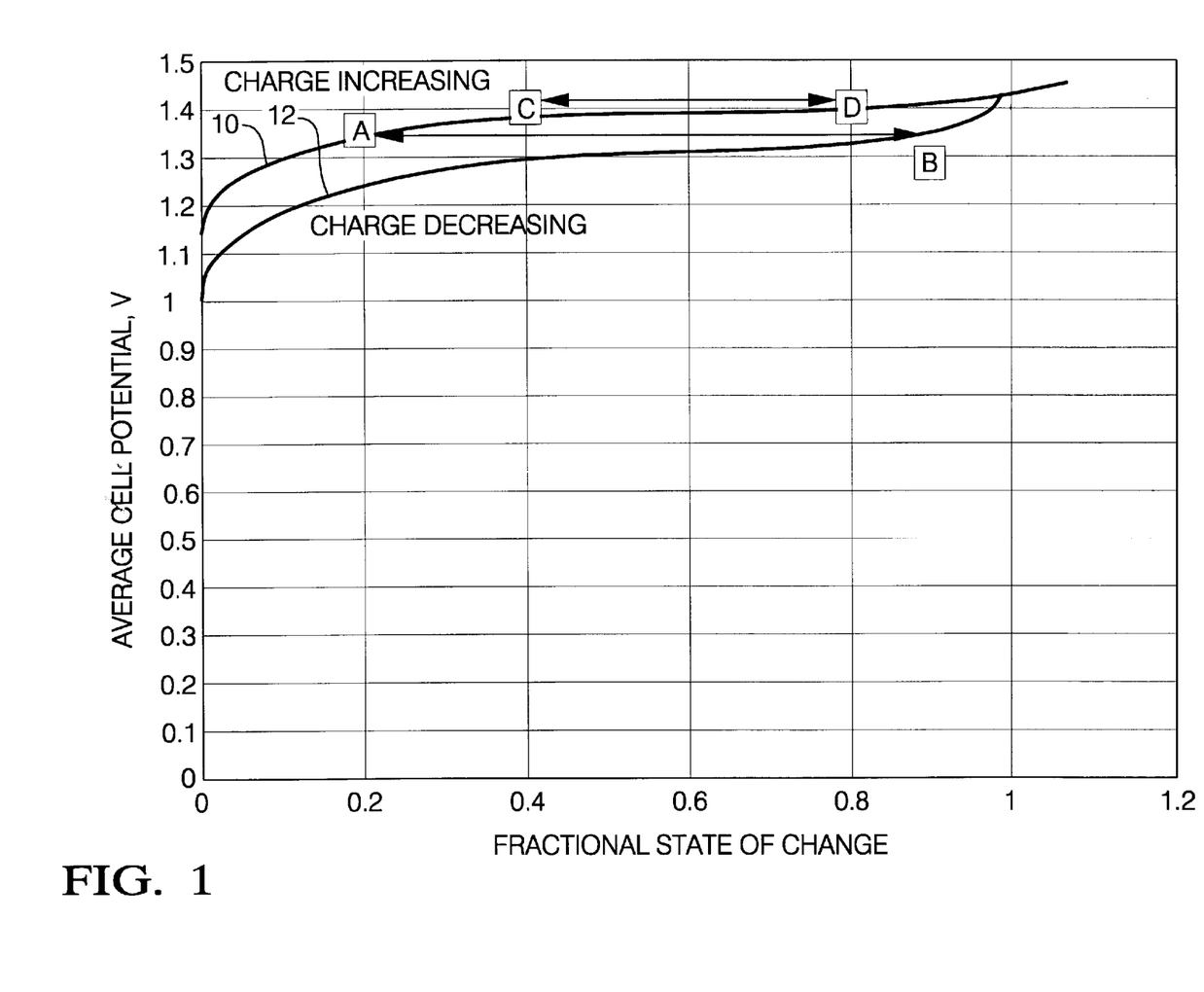
FIG. 1 is a diagrammatic drawing of a NiMH battery potential for slow rates of charge (upper curve) and discharge (lower curve)

A difficulty with NiMH batteries is predicting their SOC because of the charging and discharging characteristics of NiMH battery technology. Referring to FIG. 1, typical charge increasing 10 and charge decreasing 12 curves are illustrated for a NiMH battery. Referencing points A and B and points C and D, it can be shown that the voltages are the same while the SOCs are substantially different. Thus, it is very difficult to use an open circuit voltage to accurately predict the SOC of the NiMH battery, as the battery operating mode (charge increasing, charge sustaining or charge decreasing) must be known. When used with a hybrid vehicle, the intermittent charging and discharging of the battery pack amplifies the problems associated with predicting the SOC of a NiMH battery back.

SUMMARY OF THE INVENTION

The present invention includes a method and apparatus to more clearly determine or predict the state of charge (SOC) of a battery pack utilizing NiMH batteries or any other battery technology known in the art such as lead acid, lithium polymer, etc. The method of the present invention includes an SOC algorithm that utilizes coulomb integration and a voltage-based model to extract a battery pack's SOC from recorded current and potential data.

The present invention further includes a vehicle having both parallel and series hybrid drive systems incorporating a hybrid system controller executing the methods of the present invention, an ICE, and a MoGen that charges and discharges the battery pack. The MoGen not only provides for propulsion of the vehicle during certain vehicle operating conditions but also replaces an alternator to charge the battery pack in the vehicle and replaces a conventional starter motor to start the ICE. The hybrid drive system of the present invention will utilize the ICE and MoGen to propel or motor the vehicle during the vehicle conditions which are most efficient for the ICE or MoGen operation. The transfer of power between the MoGen and ICE or vice versa is transparent to the operator or driver, as the vehicle will perform as if there is only one drive system propelling the vehicle.

During normal operation of the vehicle when the ICE is running, the MoGen will act as an electrical generator to supply electrical power to the vehicle's electrical infrastructure (fans, radios, instrumentation, control, etc.) as well as recharging the battery pack. The battery pack and a power transfer device, such as a DC-DC converter, will supply power to the vehicle electrical infrastructure and power the MoGen when it is operating as the motoring device for the vehicle. In the motoring mode, the MoGen is an electrical load drawing current from the battery pack.

DESCRIPTION OF THE PREFERRED EMBODIMENT

Figure 2:
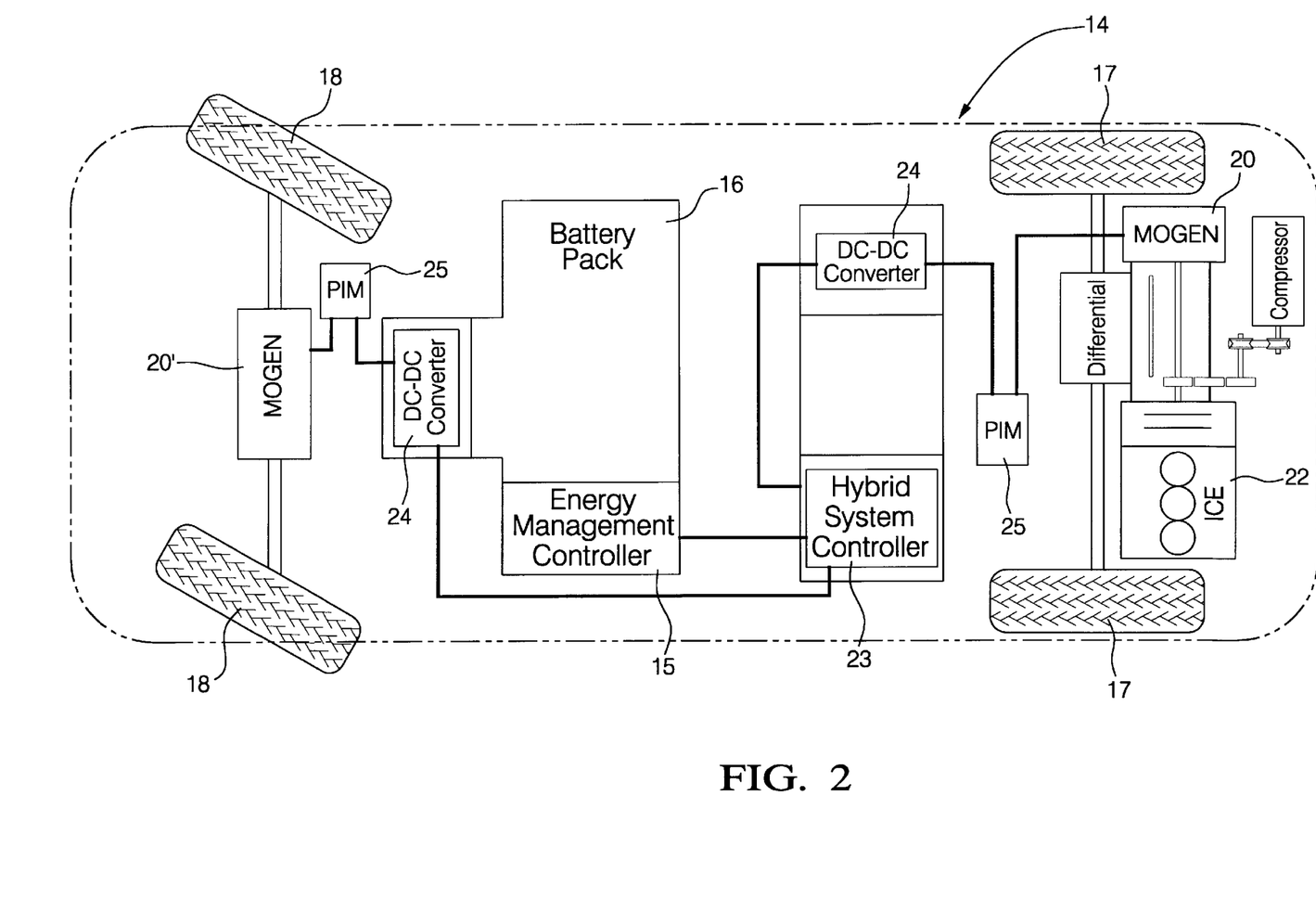
FIG. 2 is a diagrammatic drawing of the hybrid vehicle of the present invention.

FIG. 2 is a diagrammatic drawing of a hybrid vehicle 14 of the present invention. The hybrid vehicle 14 includes a battery pack 16 having a single battery module or individual battery modules. In the preferred embodiment, the battery pack 16 comprises a plurality of NiMH battery modules connected in series to produce a 376 V nominal system voltage. In alternate embodiments of the present invention, the battery pack 16 may comprise any known battery technology, including but not limited to lead acid, lithium ion, and lithium polymer batteries. An energy management controller (EMC) monitors the current, voltage, state of charge (SOC) and power output of the battery pack 16.

A motor generator (MoGen) 20 is dynamically coupled to an internal combustion engine (ICE) 22 and functions as either a motor to propel the vehicle 14 or a generator to charge the battery pack 16, depending on the operating state of the vehicle 14 (i.e., braking, stopped, or operating at a constant speed on a highway). The MoGen 20 is preferably an AC induction machine but may comprise any known electrical motor/generator technology, including, but not limited to, DC machines, synchronous machines, and switched reluctance machines. The MoGen 20 in the preferred embodiment is located on the rear of the vehicle to drive the rear wheels 17. A similar MoGen 20' is located on the front of the vehicle to drive the front wheels 18.

The MoGens 20 and 20' are controlled by an electrical control system comprising a hybrid system controller 23, DC-DC converters 24 and power inverter modules 25. The EMC 15 communicates with the hybrid system controller 23 and power inverter modules 25 to provide voltage, current, and/or power output/input limits for the battery pack 16 based on a SOC measurement. In alternate embodiments of the present invention, the EMC 15, hybrid system controller 23, DC-DC converters 24, and power inverter modules 25 may be configured as a unitary system. The EMC 15 and hybrid system controller 23 may comprise any type of control module or vehicle controller known in the art, and are equipped with nonvolatile memory (NVM), random access memory (RAM), discrete and analog input/output (I/O), a central processing unit, and communications interfaces for networking within an automotive communications network.

In generator mode, the MoGens 20 and 20' generate electrical energy that is transferred to the battery pack 16 and the DC-DC converters 24 by the controller 23 and inverter modules 25. The controller 23 and inverter modules 25 determine the direction of current flow for the MoGen 20, according to the vehicle 14 operating state. The DC-DC converters 24 provide and regulate the DC bus that is pulse-width-modulated by the inverter modules 25 to supply time varying current to the MoGens 20 and 20'. In a regeneration state (such as during braking) or charging condition, current will flow from the MoGens 20 and 20', via the inverter modules 25, to charge the battery pack 16 and provide current to the DC-DC converters 24. In a state where the MoGens 20 and 20' are needed to provide propulsion, current will flow from the battery pack 16 to the MoGens 20 and 20', via the DC-DC converters 24 and inverter modules 25, to power the MoGens 20 and 20'.

In the preferred embodiment of the present invention, the SOC of the battery pack 16 is dynamically tracked to determine when to charge the battery pack 16. The EMC 15 and hybrid controller 23 of the present invention will control a battery pack's state-of-charge (SOC) near 50% to 70% so that the charge acceptance and efficiency during regenerative braking can be realized. However, controlling the battery pack 16 to any SOC percentage is within the scope of the present invention.

As discussed previously, the methods executed by the EMC 15 to determine the SOC of the battery pack 16 include a current-based SOC method and measurement (ISOC), a voltage-based SOC method and measurement (VSOC), and a rest SOC method and measurement (RSOC). A selection method then determines which SOC measurement is the most accurate, depending on the operation of the battery pack 16.

Model Formulation

To calculate the state of charge, the following formula is utilized:

$$SOC = w(SOC_C) + (1-w)(SOC_N), \qquad [1]$$

where w is a weighting factor, $SOC_C$ is the state of charge as calculated by coulomb integration, and $SOC_N$ corresponds to a voltage-based state of charge based in part on a modified Nernst equation. For $SOC_C$:

$$SOC_C(t) = SOC(t - \Delta t) - \int_{t-\Delta t}^{t} \left[ 100 \frac{\eta_I I}{Ah_{nominal}} + S_D(T) \right] \frac{dt}{3600} \qquad [2a]$$

Time is represented by t and I denotes current, discharge currents are defined as being positive. For the battery module 16 of this example, the nominal capacity $Ah_{nominal}$ is 12.5 Ah (35° C., C/3 discharge rate; this quantity will have a mild temperature dependence over the range of application). $Ah_{nominal}$ is expected to change over the life of the battery, either as the result of module failure or the normal aging process. In a charge-depleting hybrid or for electric vehicles, the voltage-based state of charge affords an opportunity to adjust $Ah_{nominal}$ so that it remains a reasonable reflection of the actual module capacity. $Ah_{nominal}$ is determined as follows:

$$Ah_{nominal} = \min(Ah_{adaptive}, Ah_T)$$

$Ah_{adaptive}$ has as a default value corresponding to the manufacturer's rated capacity, but is allowed to adapt during discharge to be in agreement with the voltage-based estimation of capacity whenever w<0.9 (or a value appropriate for the specific application).

If w<0.9, then $$Ah_{adaptive} = \frac{Ah_{USED} + Ah_{SD} + Ah_P}{100 - SOC_N}$$

where
  $AH_{USED}$=Amp-hours discharged since the last recharge (including regen)
  $Ah_{SD}$=Amp-hours of self-discharge since last recharge
  $Ah_P$=Amp-hours of parasitic drain since last recharge
Alternatively, one can use SOC or $SOC_C$ in the denominator of the above equation. The preferred embodiment of the present invention employs $SOC_N$.

Whenever w>0.9, the last adapted value of $Ah_{adaptive}$ is used for the determination of $Ah_{nominal}$. $Ah_T$ is the temperature-compensated value of the manufacturer's rated capacity which is stored in the vehicle controller. For charge-depletion hybrid electric vehicles, it is adjusted only upon completion of a recharge to 100% SOC.

The self-discharged rate is described by:

$$S_D = k_0 \exp\left(-\frac{E_{A,S}}{R_g T}\right) SOC, \quad [3]$$

where $k_o$=1.0683×10$^7$ per hour and $E_{A,S}/R_g$=6,789 K. The current efficiency $\eta_I$ is effectively unity for the conditions near 50% SOC. A value of 1 for $\eta_I$ is used for discharge conditions and 0.99 for charge conditions. Current efficiencies may have a mild temperature dependence and decrease with increasing SOCs. The factor 3600 found in equation 2a has units of s/h, and the factor 100 found in equation 2a is employed to keep a consistent percent basis.

As previously discussed, to extract the voltage-based $SOC_N$, a voltage-based model provides the starting point:

$$V = V_0 - IR + A \int_{\zeta=t}^{\zeta=0} I(\zeta) \exp[-B(t-\zeta)] d\zeta. \quad [4a]$$

The first two terms of equation 4a, $V_O$ and IR, give rise to an ohmic description of the battery pack 16, as the battery voltage V is related to the open-circuit potential $V_O$ reduced by the ohmic drop IR, where R is the battery pack 16 resistance. The last term (the integral) on the right side of equation 4a corresponds to a superposition integral, through which past currents influence the open-circuit potential beyond the first-order effect of changing the average SOC characterizing the electrodes of the battery pack 16. (Because of the exponential weighting function, the effect of early currents is less that those of recent currents. Note that for the application of equation 4a, $\zeta$ is the dummy variable of integration.) B is an adjustable constant, 0.0366 1/s and the constant A is 0.0229 V/coulomb for the hybrid modules.

The approach for extracting the battery pack 16 resistance R from recorded data involves adding the resistance of the battery modules which make up the battery pack 16. In the preferred embodiment of the present invention where a NiMH battery is utilized, the default resistance was obtained by fitting data to the following equation:

$$R_{module} = \left(\sum_{j=1}^{n} a_j SOC^j\right) \exp\left[-\frac{E_{A,R}}{R_g}\left(\frac{1}{T} - \frac{1}{T_{ref}}\right)\right]. \quad [5]$$

The battery pack 16 resistance R is given by the number of modules multiplied by $R_{module}$, as other resistances (e.g., harnesses, etc.) have been allocated to the module resistance $R_{module}$. In the preferred embodiment, the battery pack 16 utilizes 28 modules. Thus, R=$N_{modules}R_{module}$, where $N_{modules}$=28. The activation energy $E_{A,R}$ corresponds to −6017 cal/mol. The gas constant $R_g$ is chosen with consistent units, 1.987 cal/mol-K. The reference temperature $T_{ref}$ is chosen as 35° C. or 308 K, and T is the actual temperature. The coefficients correspond to a polynomial fit to data and are listed below.

| j | 1 $a_j$, OHMS |
|---|---|
| 0 | 4.1252 × 10$^{-2}$ |
| 1 | 8.9691 × 10$^{-4}$ |
| 2 | 1.6760 × 10$^{-5}$ |
| 3 | −1.4435 × 10$^{-7}$ |
| 4 | 4.7223 × 10$^{-10}$ |

The open-circuit potential is described by a modified Nernst equation, with the inclusion of the influence of entropy of reaction and an empirical expression to capture the salient features associated with voltage hysteresis:

$$V_{0,cell} = \text{Function}(T, SOC, V_H) \quad [6]$$

$$= U_{ref}^{\theta} + V_H + \frac{R_g T_{ref}}{n_e F} \ln \frac{SOC}{100 - SOC} + (T - T_{ref}) \Delta \frac{S}{n_e F}$$

Faraday's constant (96,487 C/mol) corresponds to F, $n_e$ denotes the electrons according to the cell reaction (preferably $n_e$=1), and $\Delta S$ refers to the entropy of the cell reaction, 22 J/mol-K. (For consistent units, a value of 8.314 J/mol-K should be used for $R_g$ in Equation 4a.) The standard cell potential $U_{ref}^{\theta}$=1.345 V for charge sustaining operation. The number of cells or modules in the battery pack 16 for this example is given by N=280, thus the pack voltage is given by $V_O$=N$V_{O,cell}$. The term SOC in equation 6 represents an initial condition for the state of charge of the battery which is known. In general applications, the initial SOC is known. However, it should be noted that if the initial SOC is not known, one can implement the algorithm effectively by starting with the voltage-based SOC approach, w=0, so as to determine a suitable approximation to the initial SOC. The last term in equation 6 derives from the thermodynamic relation:

$$\frac{\partial V_0}{\partial T} = N \frac{\Delta S}{n_e F}. \quad [7]$$

Accordingly, the last term in equation 6 corresponds to a linearization of the open-circuit potential about the reference temperature, 35° C. (308 K), in the preferred embodiment of the present invention.

For the hysteresis contribution, the following first-order differential equation is constructed to calculate a hysteresis voltage $V_H$:

$$\frac{\partial V_H}{\partial t} = -\beta\left[\eta_I I + \varepsilon(Ah_{nominal})k_0 \exp\left(-\frac{E_{A,S}}{R_g T}\right)\frac{SOC}{100}\right] \quad [8]$$

$$\left(\frac{\gamma Q_M + \text{sign}(I)V_H}{Q_M}\right).$$

This equation constructs a varying hysteresis voltage for the present invention. The hysteresis voltage is structured so that for prolonged charge currents, or short but very large charge currents, the hysteresis voltage tends to be +50 mV per cell. By selecting the appropriate parameter values for 280 cells per pack, $V_H$ corresponds to 11.2 volts. The exact opposite holds for discharge (positive) currents. Note also that if the current remains at zero for a long time, the hysteresis voltage tends to the charge-decreasing condition (−50 mV per cell) through self-discharge.

The equations detailed above are the governing equations for the present invention. The next section provides equations to allow the construction or implementation of the SOC algorithms of the present invention with the controller 23 of the present invention as seen in FIGS. 3 and 4.

Figure 3:
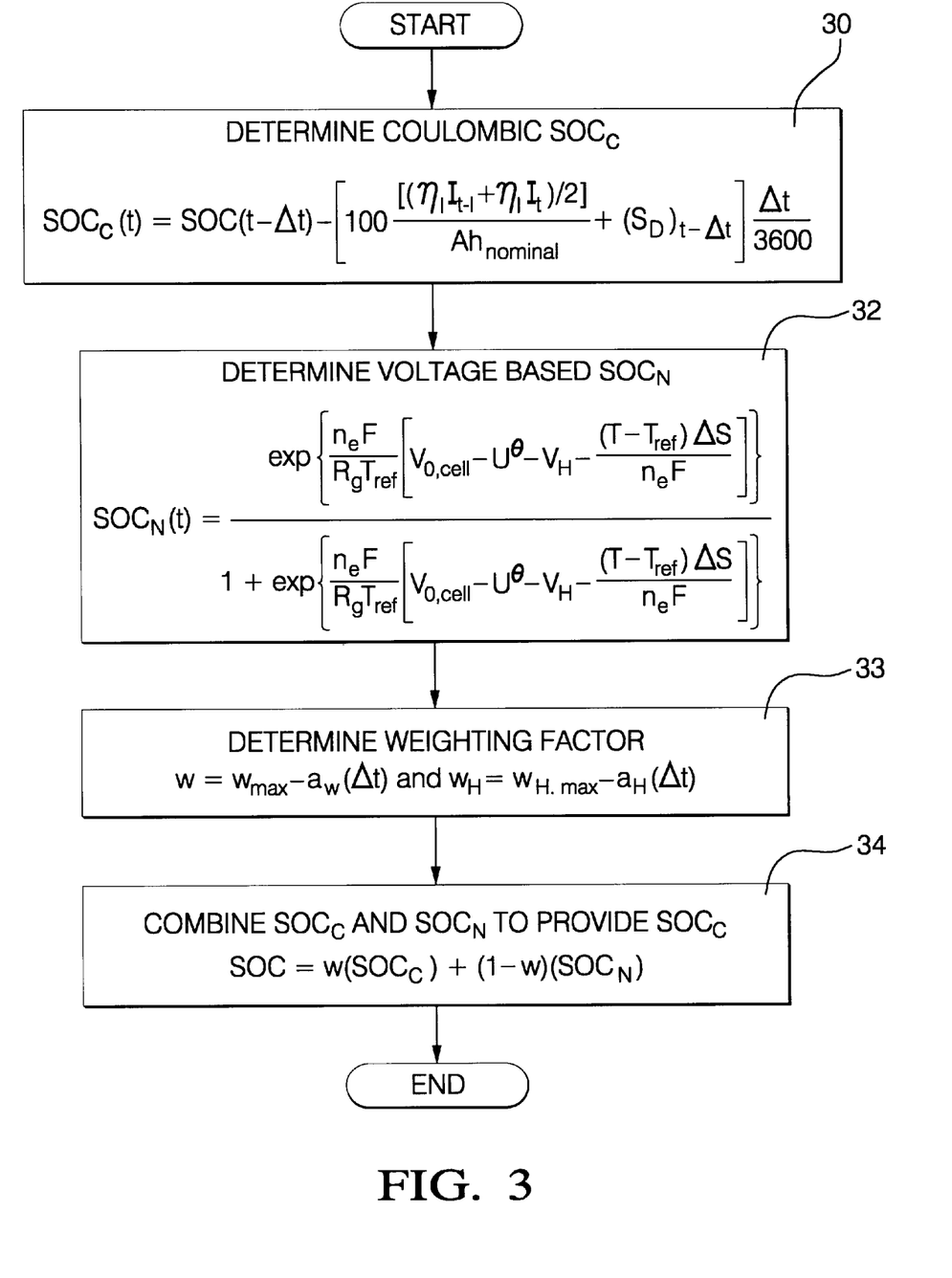
FIGS. 3 and 4 are flowcharts illustrating the preferred method of the present invention.
Figure 4:
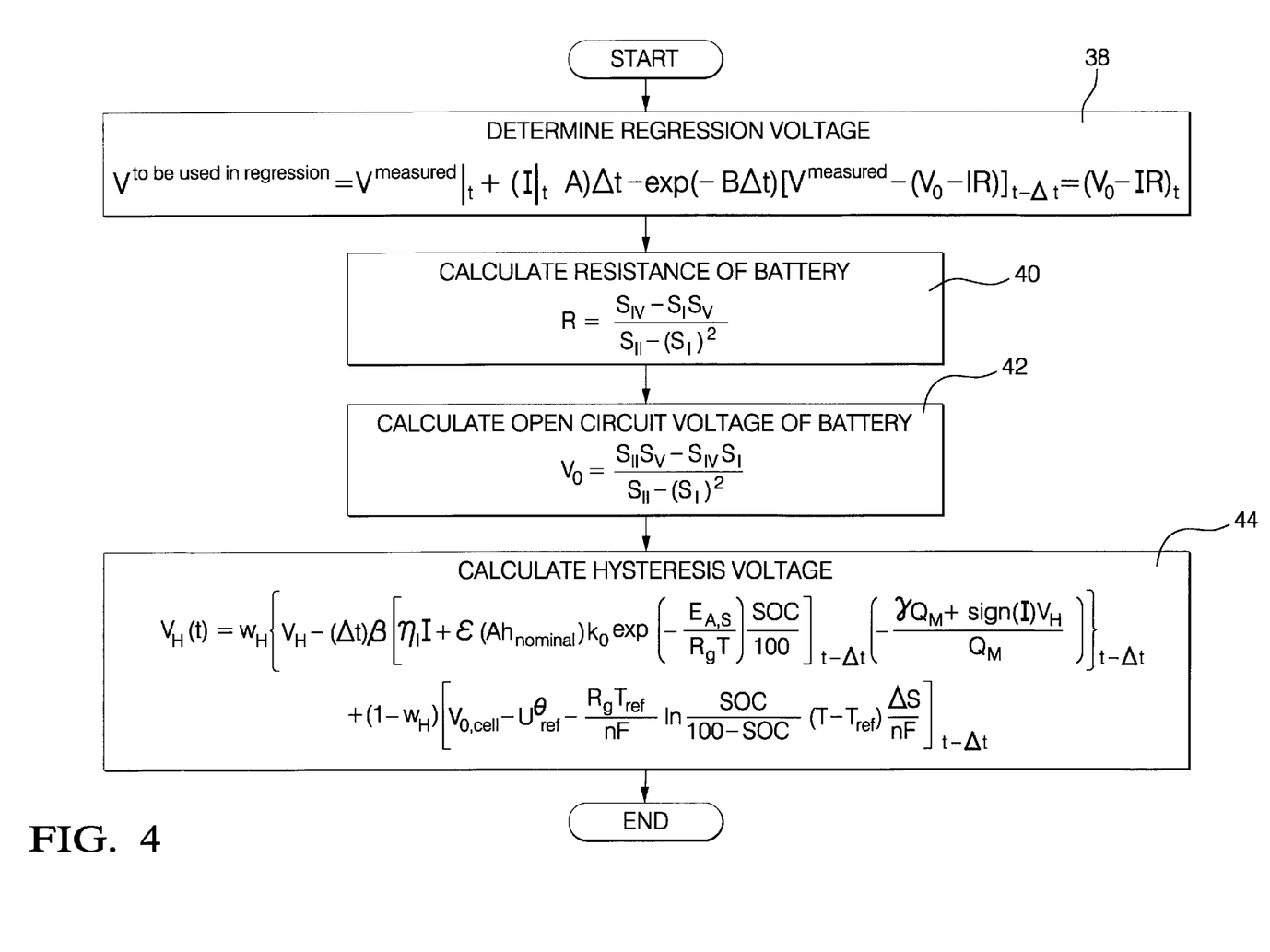

FIG. 3 is a general overview of the method of the present invention and FIG. 4 is a flowchart of the $SOC_N$ voltage model of the present invention. In the preferred embodiment of the method of the present invention, the coulomb integration model at block 30 in FIG. 3 is used to determine $SOC_C$ using the following equation:

$$SOC_C(t) = SOC(t - \Delta t) - \left[100 \frac{[(\eta_I I_{t-1} + \eta_I I_t)/2]}{Ah_{nominal}} + (S_D)_{t-\Delta t}\right] \frac{\Delta t}{3600}. \quad [2b]$$

The difference between the present time and the last recorded time is given by $\Delta t$. The term SOC in equation 2b is an initial known state of charge. Equation 2a should be referenced to provide definitions for the components of equation 2b. Next, at block 32, $SOC_N$ is calculated. The weighting factor w is determined at block 33 and the final SOC estimation is done at block 34. The steps in blocks 32, 33 and 34 will be discussed in detail below.

Referring to FIG. 4, the variables used in the $SOC_N$ calculation of block 32 are determined. At block 38, the measured voltage is corrected for the superposition integral in equation 4b. Equation 4a has been recast as the following recursion relation for evaluation purposes:

$$V|_t = (V_O - IR)_t - (I|_r A)\Delta t + \exp(-B\Delta t)[V - (V_O - IR)]_{t-\Delta t} \quad [4b]$$

where the subscripts t and t−Δt denote the time at which the quantities are to be evaluated. This equation is a particularly simple recursion relation in that only variables calculated at the previous time step are required to calculate the voltage at time t. At block 38, to implement equation 4b, one replaces the battery voltages with measured values using the following equation:

$$V^{to\ be\ used\ in\ regression} = V^{measured}|_t + (I|_r A)\Delta t - \exp(-B\Delta t)[V^{measured} - (V_O - IR)]_{t-\Delta t} = (V_O - IR)_t \quad [4c]$$

Thus, the regression analysis to determine the open-circuit potential and resistance is based on the voltage quantity appearing on the left side of equation 4c, the regression voltage, and a least-squares analysis of the corrected voltage data (corresponding to the regression voltage) should yield a good approximation for the ohmic resistance and open-circuit potential. Next, at blocks 40 and 42, the open-circuit voltage $V_O$ and the resistance R are extracted from the corrected battery voltage regression voltage (referred to simply as V in the least-squares formulas to follow) and current I. This extraction procedure is based on a least-squares approach, applied to data corresponding to a specified time interval (e.g., the previous 30 seconds in the examples herein). This approach is consistent with the extraction of parameters from model data if the model is linear. Specifically, the following definitions are applied:

$$s_I = \frac{1}{n}\sum_{j=1}^{n} I_j$$

$$s_{II} = \frac{1}{n}\sum_{j=1}^{n} I_j^2$$

$$s_V = \frac{1}{n}\sum_{j=1}^{n} V_j$$

$$s_{IV} = \frac{1}{n}\sum_{j=1}^{n} I_j V_j,$$

where n represents the number of recorded current-potential data points to be included in the extraction of the open-circuit voltage $V_O$ and the resistance R. Using these expressions, one obtains the following, $$R = -\frac{s_{IV} - s_I s_V}{s_{II} - (s_I)^2} \quad [9]$$

and $$V_0 = \frac{s_{II} s_V - s_{IV} s_I}{s_{II} - (s_I)^2}. \quad [10]$$

These equations fail when $s_{II} - (s_I)^2 = 0$, or when this quantity is nearly zero. In addition, the equations can fail to provide a reasonable result when many of the recorded currents used in the least-squares are of similar value. Thus, the following two quantities are defined as such:

$$\text{denom\_test} = \begin{cases} 1 & \text{if } s_{II} - (s_I)^2 \geq \underline{0.5\,A} \\ 0 & \text{if } s_{II} - (s_I)^2 < \underline{0.5\,A} \end{cases}$$

and $$I_{max} = \left[\text{max current over the most recent } \left(\frac{2}{3}n\right) \text{ data points}\right]$$

$$I_{min} = \left[\text{min current over the most recent } \left(\frac{2}{3}n\right) \text{ data points}\right]$$

$$I\_\text{test} = \begin{cases} 1 & \text{if } \text{abs}(I_{max} - I_{min}) \geq \underline{0.1} \times \text{abs}(s_I) \\ 0 & \text{if } \text{abs}(I_{max} - I_{min}) < \underline{0.1} \times \text{abs}(s_I) \end{cases}$$

Underlined values represent preferred calibrations.

The following conditions are now applied so as to remove the use of the regression routine when inappropriate:

If denom_test or I_test are 0 then $$R(t) = R(t-\Delta t) \text{ and } V_O = V(t) + I(t)R(t),$$

where V(t) corresponds to the corrected regression voltage provided on the left side of equation 4c. Note also that the default resistance provides R(t=0). Hence the I_test condition asserts that if there is little variation in the measured current, relative to its average value, then neither the open-circuit voltage nor the resistance is extracted by means of the regression analysis. In addition, the resistance is bounded so that it cannot stray far from its default value provided by equation 5. Thus:

$$R(t) = \max[0.5 N_{module} R_{module}, \min(0.5 N_{module} R_{module}, R_{least\ squares})].$$

The factors 0.5 and 1.5 used in this equation can be treated as calibrations.

The hysteresis voltage, $V_H$, is determined at block 44 and is addressed by the following time integration:

$$V_H(t) = w_H \left\{ V_H - (\Delta t)\beta \left[ \eta_I I + \varepsilon(Ah_{nominal})k_0(\exp\left(-\frac{E_{A,S}}{R_g T}\right)\frac{SOC}{100}\right]_{t-\Delta t} \right.$$
$$\left. \left(\frac{\gamma Q_M + sign(I)V_H}{Q_M}\right) \right\}\Big|_{t-\Delta t} +$$
$$(1-w_H)\left[V_{0,cell} - U_{ref}^\theta - \frac{R_g T_{ref}}{nF}\ln\frac{SOC}{100-SOC} - (T-T_{ref})\frac{\Delta S}{nF}\right]_{t-\Delta t}$$
[11]

Although the subscript on the large brackets and braces indicates that values to the right of this equation can be evaluated from the previous time step, it should be noted that the current is known (measured) for all time. Accordingly, the current employed (and the current efficiency) can be taken as the average of the present and previous time step. In addition, it is important to note that this equation is not a straight-forward time integration of equation 5 unless the weighting factor $w_H$, is set to unity. Thus, the second line of the above equation allows for a correction to the extraction of the hysteresis voltage through the recognition that the previous time step value for the SOC can be used to calculate an open-circuit voltage (cf. equation 6)—this back-calculated open-circuit voltage provides a value of $V_H$ that will quite likely differ from that calculated through equation 5. Thus, the approach taken in the above equation is to construct a weighted sum.

Returning to block 32 of FIG. 3, open-circuit voltage $V_O$ can now be transformed into a voltage-based state of charge, including the hysteresis voltage. The modified Nernst equation is used to express the state of charge in terms of the measured (i.e., extracted) open-circuit voltage and other known quantities.

$$SOC_N(t) = \frac{\exp\left\{\frac{n_e F}{R_g T_{ref}}\left[V_{0,cell} - U^\theta - V_H - \frac{(T-T_{ref})\Delta S}{n_e F}\right]\right\}}{1 + \exp\left\{\frac{n_e F}{R_g T_{ref}}\left[V_{0,cell} - U^\theta - V_H - \frac{(T-T_{ref})\Delta S}{n_e F}\right]\right\}}\Bigg|_t$$

Referring to block 34 of FIG. 3, the combined SOC or estimate of the battery SOC can now be calculated after determining the weighting factor at block 33 using the equation:

$$SOC = w(SOC_C) + (1-w)(SOC_N).$$

In using the weighting factors w and $w_H$, the influence of the time step size varies. That is, if very small time steps are employed, then the weighting factor should be altered so that time-dependent quantities are not lost from the calculation and instead are allowed to evolve in accordance with their particular time constants. Thus, the following approach at block 33 is applied in the preferred embodiment of the present invention do determine the weighting factor.

$$w = w_{max} - a_w(\Delta t) \text{ and } w_H = w_{H,max} - a_H(\Delta t).$$ [12]

In addition, as described above for the resistance, these weighting factors are bounded (between 0 and 1 here).

When the battery pack 16 SOC exceeds about 95%, the voltage-based SOC could become inaccurate, owing to the less predictable processes associated with oxygen evolution on the nickel electrode. Thus, in the current example, for SOCs above 95%, w is set to unity. Similarly, for short time (i.e., before the regression analysis allows for accurate fitting of the resistance and open-circuit potential, 30 seconds in this example), w is set to unity, and the SOC is calculated for this short time based solely on coulomb integration. Yet another special case results when the battery has been at rest for prolonged periods. In this case, the hysteresis model returns a value of $V_H$ that is less than −45 mV, and the magnitude of the current is quite low (e.g., less than 0.1 A). In this case, the voltage-based SOC model is likely to provide the most accurate estimate for the combined SOC—an extreme case would be for a battery sitting at rest for many days, in which case the chemistry is dictated by self-discharge processes, and the charge-decreasing Nernst equation provides an accurate estimation for the battery's open-circuit potential. Thus, if abs[I]<0.1 and $V_H$<−0.045 then w=0.5.

The quantity $\alpha_w$ is obtained as follows. First, the open-circuit potential is differentiated with respect to SOC, $$\frac{\partial V_0}{\partial(SOC_N)} = N\frac{R_g T_{ref}}{n_e F}\left[\frac{100}{SOC(100-SOC)}\right].$$ [13]

Next, $\alpha_w$ is constructed as follows:

$$\alpha_w = \begin{cases} \text{For } SOC \geq 50\%: \alpha_w|_{50\% \, SOC} \\ \text{For } SOC < 50\%: \min\left[10, \frac{\frac{\partial V_0}{\partial(SOC_N)}}{\frac{\partial V_0}{\partial(SOC_N)}\big|_{50\% \, SOC}}\right] \times \alpha_w|_{50\% \, SOC} \end{cases}$$ [14]

The quantity 10 in this equation is underlined to note that it can be a calibration. Similarly, the value given to $\alpha_w$ at 50% SOC is entered as a calibration. The Nernst equation need not be the expression used to construct the partial derivatives; that is, a different expression can be utilized, or a table of values for the open-circuit potential versus SOC can be used to numerically extract the derivatives. In summary, when $\alpha_w$ is employed in the algorithm, it is entered in the data file as a calibration; this calibration value is used for SOCs greater than or equal to 50%. For SOC values less than 50%, equation 14 indicates a larger value of $\alpha_w$ is returned when the partial derivative is large, consistent with large changes in the open-circuit potential for small changes in the SOC. A (calibrated) maximum value of 10 is suggested for $\alpha_w$ in equation 14.

Finally, the calculation of the weighting factor w is determined as follows. Underlined values correspond to values that can be calibrations.

If
t<30 s or
SOC>95% or
$I_{test}$>0.5 A or
denom_test=0 and abs(I)>0.1 A or
denom_test=0 and $V_H$>−0.045 V then w=1;
else
w=min{1, max[0.5, 1−$\alpha_w(\Delta t)$]}

Calibration changes and minor changes to the implementation are within the scope of the present invention, and the overall approach, based on the equations 1, 2, 4, 6 [most generally $V_{O,cell}$=Function(T,SOC,$V_H$)] and the equations 8 through 14, is an innovative method to determine the SOC of a battery pack 16.

While this invention has been described in terms of some specific embodiments, it will be appreciated that other forms can readily be adapted by one skilled in the art. Accordingly, the scope of this invention is to be considered limited only by the following claims.

What is claimed is:

1. A method of determining the state of charge of a battery comprising:
    determining a current-based state of charge measurement based on coulomb integration;
    determining a voltage-based state of charge measurement based on the resistance of the battery and a hysteresis voltage; and
    combining the current-based state of charge measurement and the voltage-based state of charge measurement with a weighting factor to generate the state of charge of the battery.

2. The method of claim 1 wherein the step of determining the current-based state of charge is based on the equation:

$$SOC_C(t) = SOC(t - \Delta t) - \left[100\frac{[(\eta_I I_{t-1} + \eta_I I_t)/2]}{Ah_{nominal}} + (S_D)_{t-\Delta t}\right]\frac{\Delta t}{3600}.$$

3. The method of claim 1 wherein the step of determining a voltage-based state of charge further comprises determining the battery voltage using the open circuit voltage of the battery and the ohmic drop of the battery.

4. The method of claim 3 wherein the step of determining a voltage-based state of charge further comprises determining the open circuit voltage of the battery as a function of temperature, hysteresis voltage and an initial state of charge of the battery.

5. The method of claim 1 wherein the battery is a nickel/metal hydride battery.

6. A method of determining the state of charge of a nickel/metal hydride battery comprising:
    determining a first state of charge measurement based on coulomb integration;
    determining a second state of charge measurement based on a voltage model;
    determining a weighting factor to be used in combining said first state of charge measurement and said second stage of charge measurement; and
    combining said first state of charge measurement and said second stage of charge measurement to determine the state of charge of the nickel/metal hydride battery.

7. The method of claim 6 wherein the step of determining the second state of charge measurement comprises:
    determining the standard cell potential of the nickel/metal hydride battery;
    determining the entropy of the cell reaction of the nickel/metal hydride battery; and
    determining a hysteresis voltage of the nickel/metal hydride battery.

8. The method of claim 6 further wherein the step of combining said first state of charge measurement and said second stage of charge measurement to determine the state of charge of the nickel/metal hydride battery comprises using the equation:

$$SOC=w(SOC_C)+(1-w)(SOC_N).$$

9. The method of claim 6 wherein the step of determining the hysteresis voltage comprises monitoring the voltage and current of the battery.

10. A vehicle powertrain control system comprising:
    a battery pack;
    a power inverter coupled to said battery pack;
    a controller controlling said power inverter, said controller monitoring the state of charge of said battery pack; and
    a state of charge algorithm included in said controller, said state of charge algorithm based on a coulomb integration method and a voltage based model.

11. The vehicle powertrain control system of claim 10 wherein said battery pack comprises at least one nickel/metal hydride battery.

12. The vehicle powertrain control system of claim 10 wherein said battery pack comprises a plurality of nickel/metal hydride batteries connected in series.

13. The vehicle powertrain control system of claim 10 wherein said battery pack comprises at least one lead acid battery.

14. The vehicle powertrain control system of claim 10 wherein said battery pack comprises at least one lithium battery.

15. The vehicle powertrain control system of claim 10 wherein said controller is capable of communicating over an automotive communications network.

16. The vehicle powertrain control system of claim 15 wherein said automotive communications network comprises a CAN network.

17. The vehicle powertrain control system of claim 10 further comprising a motor/generator coupled to said inverter.

* * * * *